US006396741B1

(12) United States Patent
Bloom et al.

(10) Patent No.: US 6,396,741 B1
(45) Date of Patent: May 28, 2002

(54) PROGRAMMING OF NONVOLATILE MEMORY CELLS

(75) Inventors: Ilan Bloom, Haifa; Boaz Eitan, Ra'anana; Zeev Cohen, Safed; David Finzi, Haifa; Eduardo Maayan, Kfar Saba, all of (IL)

(73) Assignees: Saifun Semiconductors Ltd., Netanya; Tower Semiconductors Ltd., Migdal Ha'emek, both of (IL)

( * ) Notice: Subject to any disclaimer, the term of this patent is extended or adjusted under 35 U.S.C. 154(b) by 0 days.

(21) Appl. No.: 09/563,923

(22) Filed: May 4, 2000

(51) Int. Cl.[7] .............................................. G11C 16/06

(52) U.S. Cl. ........................ 365/185.22; 365/185.19; 365/185.28

(58) Field of Search .................. 365/185.22, 185.18, 365/185.19, 185.28, 185.01

(56) References Cited

U.S. PATENT DOCUMENTS

| 3,895,360 A | 7/1975 | Cricchi et al. |
|---|---|---|
| 4,016,588 A | 4/1977 | Ohya et al. |
| 4,173,766 A | 11/1979 | Hayes |
| 4,173,791 A | 11/1979 | Bell |
| 4,527,257 A | 7/1985 | Cricchi |
| 4,630,085 A | 12/1986 | Koyama |
| 4,742,491 A | 5/1988 | Liang et al. |
| 5,021,999 A | 6/1991 | Kohda et al. |
| 5,159,570 A | 10/1992 | Mitchell et al. |
| 5,172,338 A | 12/1992 | Mehrotra et al. |
| 5,214,303 A | 5/1993 | Aoki |
| 5,305,262 A | 4/1994 | Yoneda |
| 5,349,221 A | 9/1994 | Shimoji |
| 5,359,554 A | 10/1994 | Odake et al. |
| 5,414,693 A | 5/1995 | Ma et al. |
| 5,418,743 A | 5/1995 | Tomioka et al. |
| 5,426,605 A | 6/1995 | Van Berkel et al. |
| 5,434,825 A | 7/1995 | Harari |
| 5,455,793 A | 10/1995 | Amin et al. |
| 5,477,499 A | 12/1995 | Van Buskirk et al. |
| 5,523,972 A | 6/1996 | Rashid et al. |
| 5,654,568 A | 8/1997 | Nakao |
| 5,768,192 A | 6/1998 | Eitan |
| 5,787,036 A | 7/1998 | Okazawa |
| 5,812,449 A | 9/1998 | Song |
| 5,825,686 A | 10/1998 | Schmitt-Landsiedel |
| 5,870,335 A | * 2/1999 | Khan et al. ............ 365/185.18 |
| 6,011,725 A | 1/2000 | Eitan |
| 6,030,871 A | 2/2000 | Eitan |
| 6,034,896 A | 3/2000 | Ranaweera et al. |
| 6,097,639 A | * 8/2000 | Choi et al. ............. 365/185.28 |
| 6,137,718 A | * 10/2000 | Meisinger .............. 365/185.03 |
| 6,163,048 A | * 12/2000 | Hirose et al. ............... 257/315 |
| 6,175,523 B1 | 1/2001 | Yang et al. |

(List continued on next page.)

FOREIGN PATENT DOCUMENTS

| GB | 2157489 | 10/1985 |
|---|---|---|
| JP | 07193151 | 7/1995 |
| JP | 09162314 | 6/1997 |

OTHER PUBLICATIONS

U.S. application No. 08/905,286, Eitan, filed Jul. 30, 1997.
U.S. application No. 09/082,280, Eitan, filed May 20, 1998.
U.S. application No. 09/348,720, Eitan, filed Jul. 6, 1999.

(List continued on next page.)

Primary Examiner—Hoai V. Ho
(74) Attorney, Agent, or Firm—Eitan, Pearl, Latzer & Cohen-Zedek

(57) ABSTRACT

A method for programming an NROM cell which includes the steps of applying a drain, a source and a gate voltage to the cell and verifying a programmed of a non-programmed state of the cell. If the cell is in the non-programmed state, the method includes the steps of increasing the drain voltage and maintaining the gate voltage at a constant level during at least a part of the step of increasing. The steeps of applying, verifying, increasing and maintaining are repeated until the cell reaches the programmed state.

43 Claims, 14 Drawing Sheets

U.S. PATENT DOCUMENTS

| | | |
|---|---|---|
| 6,181,605 B1 | 1/2001 | Hollmer et al. |
| 6,201,282 B1 | 3/2001 | Eitan |
| 6,215,702 B1 | 4/2001 | Derhacobian et al. |
| 6,240,040 B1 | 5/2001 | Akaogi et al. |
| 6,266,281 B1 | 7/2001 | Derhacobian et al. |
| 6,331,950 B1 | 12/2001 | Kuo et al. |

OTHER PUBLICATIONS

U.S. application No. 09/413,408, Eitan, filed Oct. 6, 1999.

U.S. application No. 09/536,125, Eitan, filed Mar. 28, 2000.

Chan et al., "A True Single–Transistor Oxide–Nitride–Oxide EEPROM Device," *IEEE Electron Device Letters*, vol. EDL–8, No. 3, Mar. 1987.

Eitan et al., "Hot–Electron Injection into the Oxide in n–Channel MOS Devices," *IEEE Transactions on Electron Devices*, vol. ED–38, No. 3, pp. 328–340, Mar. 1981.

Roy, Anariban "Characterization and Modeling of Charge Trapping and Retention in Novel Multi–Dielectic Nonvolatile Semiconductor Memory Device," Doctoral Dissertation, Sherman Fairchild Center, Department of Computer Science and Electrical Engineering, pp. 1–35, 1989.

Bruno Ricco, "Nonvolatile Multilevel Memories for Digital Application", IEEE, vol. 86, No. 12, issued Dec. 1998, pp. 2399–2421.

* cited by examiner

PROGRAMMING OF NONVOLATILE MEMORY CELLS

FIELD OF THE INVENTION

The present invention relates generally to electrically erasable, programmable read only memory (EEPROM) cells and specifically, to methods for programming thereto.

BACKGROUND OF THE INVENTION

FIG. 1, to which reference is made, illustrates a typical prior art floating gate cell, comprising two diffusion areas, source 102 and drain 104, embedded in a substrate 105, between which is a channel 100. A floating gate 101 is located above but insulated from channel 100, and a gate 112 is located above but insulated from floating gate 101.

Typically, when programming the floating gate cell, programming voltages $V_G$ and $V_D$ are applied to gate 101 and drain 104, respectively, and a low source voltage $V_s$ is applied to source 102. For array applications, a row of gates are formed into a word line, and a column of drain and source are formed into bit lines along which voltages $V_D$ and $V_s$, respectively, are supplied.

The source and drain voltages $V_s$ and $V_D$, respectively, create a lateral field that pulls channel electrons from source 102 to drain 104. This is indicated by arrow 10. Near drain 104, a vertical field created by the gate voltage $V_G$ allows hot channel electrons to be injected (arrow 12) into floating gate 101. Once injected into floating gate 101, the electrons are distributed equally across the entire gate, increasing the threshold voltage $V_{TH}$ of gate 101.

Another type of non-volatile cell is the nitride, read only memory (NROM) cells are described in Applicant's copending U.S. patent application Ser. No. 08/905,286, entitled "Two Bit Non-Volatile Electrically Erasable And Programmable Semiconductor Memory Cell Utilizing Asymmetrical Charge Trapping" which was filed Aug. 1, 1997. The disclosure of the above-identified application is incorporated herein by reference.

Similar to the floating gate cell of FIG. 1, the NROM cell illustrated in FIGS. 2A and 2B, to which reference is now made, has channel 100 between two diffusion areas 102 and 104. However, unlike the floating gate cell, the NROM cell has two separated and separately chargeable areas 106 and 108. Each chargeable area defines one bit. For the dual bit cell of FIGS. 2, the separately chargeable areas 106 and 108 are found within a nitride layer 110 formed in an oxide-nitrideoxide (ONO) sandwich (layers 109, 110 and 111) underneath gate 112.

To program the left bit in area 106, the left diffusion area 102 receives the high programming voltage $V_D$ (i.e. area 102 the drain) and right diffusion area 104 is grounded (i.e. area 104 the source). Hence the electrons flow from area 104 to area 102. This is indicated by arrow 114. The channel hot electrons are then injected into the nitride layer, in area 106. The negative charge in area 106 raise the threshold voltage of the cell, if read in the reverse direction.

The opposite is true for programming area 108; the left diffusion area 102 is the source (i.e. grounded) and right diffusion area 104 is the drain (i.e. receives high programming voltage $V_D$). The cell is therefore programmed in the opposite direction, as indicated by arrow 113, and the electrons then jump up into chargeable area 108.

For NROM cells, each bit is read in the direction opposite (a "reverse read") to that of its programming direction. An explanation of the reverse read process is described in U.S. patent application Ser. No. 08/905,286, mentioned above. Thus, to read the left bit stored in area 106, right diffusion area 104 is the drain and left diffusion area 102 is the source. This is known as the "read through" direction, indicated by arrow 113. To read the right bit stored in area 108, the cell is read in the opposite direction, indicated by arrow 114. Thus, left diffusion area 102 is the drain and right diffusion area 104 is the source.

During the read operation, the presence of the gate and drain voltages $V_G$ and $V_D$, respectively, induce a depletion layer 54 (FIG. 2B) and an inversion layer 52 in the center of channel 100. The drain voltage $V_D$ is large enough to induce a depletion region 55 near drain 104 which extends to the depletion layer 54 of channel 100. This is known as "barrier lowering" and it causes "punch-through" of electrons from the inversion layer 52 to the drain 104.

Since area 106 is near left diffusion area 102 which, for this case, acts as the source (i.e. low voltage level), the charge state of area 106 will determine whether or not the inversion layer 52 is extended to the source 102. If enough electrons are trapped in left area 106, then the voltage thereacross will not be sufficient to extend inversion layer 52 to the source 102, the cells current will be low, and a "0" will be read. The opposite is true if area 106 has no charge.

Reference is now made to FIGS. 3A, 3B and 3C, which are timing diagrams of an exemplary prior art programming schedule for NROM cells. Typically, when programming an NROM cell, programming pulses 120A, 120B and 120C, consisting of programming voltages $V_D$, $V_s$, and $V_G$, respectively, are applied to the cell. Programming pulses 120 are then followed by program verify pulses 122A, 122B and 122C, consisting of read voltages $V_D$, $V_S$, and $V_G$, respectively, during which time the cell is read.

If there are enough electrons trapped in the bit, a "0" is read, and the cell is verified as programmed. If, however, during the read operation, the inversion layer is not strong enough to prevent the current flow through the channel, than the bit will be read as a "1", and the cell will fail program verification.

The sequence of pulses 120 and 122 are repeatedly applied until the effect of the charged trapped in area 106 (or 108) has reached the desired level and the cell is considered "programmed". The programming process is then terminated.

Due to ever demanding manufacturing requirements, the semiconductor industry is continuously searching for ways to improve the programming process. There exist two contradicting programming requirements; 1) to increase the programming speed, thereby reducing the cost of testing the part, and 2) to improve the control of the final programmed threshold, thereby enhancing product reliability.

The first requirement can easily be met just by increasing the drain and gate potentials to their maximum values. However, this strategy will not meet the second requirement due to many process and environmental parameters that affect the programming rate and its variations.

To achieve the second requirement, there are two basic options, controlling the length of the programming sequence, and/or stepping the amplitude of the gate voltage potential.

The article "Nonvolatile Multilevel Memories for Digital Applications", published in the *IEEE Magazine* on Dec. 12, 1998, discusses a number of proposed methods for programming multi-level floating gate circuits, including that of controlling the programming time length. One such method is discussed In the section Programming and Accuracy, 2)

Drain Voltage Programming, as follows: 1) a constant gate voltage is set, 2) per bit level of the multilevel cell, a constant drain voltage is determined, and 3) the cell is programmed for a predetermined time period. At the completion of the time period, the programming is terminated. Alternately, the article describes an approach whereby after each programming pulse, the threshold voltage $V_{TH}$ is verified. Upon reaching the target threshold voltage, programming is terminated.

U.S. Pat. No. 5,523,972 describes a floating gate method that entails incrementally increasing the programming gate voltage $V_G$, while keeping other factors constant (e.g. source and drain voltages, $V_s$ and $V_D$, respectively). In the described programming algorithm, each cell is checked to determine whether or not it has reached the desired state. If not, a programming gate voltage pulse of a slightly higher voltage is applied to the cell. The charge level is checked again, and if the desired state has not yet been reached, the voltage is raised again and applied. This process is repeated until all the cells reach the desired level.

U.S. Pat. No. 5,172,338 describes a programming algorithm similar to that described in the U.S. Pat. No. 5,523,972, however, on a per cell basis. Every cell that reaches the desired level does not receive the drain voltage of the next step. This sequence is continued until the last bit of the byte word/group is programmed.

As explained in both "Nonvolatile Multilevel Memories for Digital Applications" and U.S. Pat. No. 5,523,972, in floating gate cells, the relationship between $V_G$ and $V_{TH}$ is linear. As such, control of programming is relatively precise since, for every change in the gate voltage $V_G$, there is a similar change in the threshold voltage $V_{TH}$ of the cell.

Nonetheless, there are many factors influencing the programming speed, and consequently, the programming speed may vary from cell to cell even when the same level of programming voltage is applied thereto. FIG. 4, to which reference is now made, illustrates the typical variation of programming time for a normal population of memory cells. Point 126 depicts the cell with the fastest programming speed, while point 128 represents the cell with the slowest programming speed. The variance in time between point 126 to point 128 can be as large as 500x.

The wide variation of programming speeds creates problems during programming of memory cell arrays. These arrays may contain many millions of memory cells, each with its own distinct programming speed. Some cells may reach their programmed level in a shorter time than needed for other cells to reach their programmed levels. Thus, the programming process needs to be terminated for some cells, while for other, it needs to be continued.

Some of the factors influencing the programming speed in floating gate cells are: variations in process parameters such as channel length, gate coupling ratio, drain coupling ratio, source resistance variations (array effect) and channel doping variations. Another factor influencing the program rate is the temperature of the product during programming; generally, the lower the temperature, the faster the programming rate.

In NROM cells, the parameters that affect the programming speed are: the ONO thickness, the channel length, the channel doping and the temperature.

When an improper programming algorithm is used, some cells may receive too high programming voltages or may be programmed for too long. In such instances, an overabundance of charge is introduced into the gate or retention layer (NROM) and the memory cell is "overprogrammed".

In floating gate cells, over-programming deteriorates the quality of the oxide layer (reference number 109, FIG. 1), creating reliability problems due to the degradation of the quality of the product. Furthermore, continuing to apply high voltage pulses once the unit cells have already reached the programmed level wastes power and creates a power dissipation problem.

Moreover, as to be described below, in multi-level floating gate products, over-programming can lead to information read failures. Reference is now made to FIG. 5, a graph illustrating the different threshold voltage levels comprised within a multi-level floating gate cell. As depicted in the FIG. 5, each bit in the multi-level floating gate cell is defined by a predefined region of the third bit in region 136 (from line X to line Y), and so on. When a cell is over-programmed, the resultant threshold voltage may overshoot the desired region, thus leading to a read error or failure.

Further problems arise when programming both bits of multi-bit memory cells, such as the two-bit NROM cell. Once the first bit is programmed, the threshold voltage $V_{TH}$ of the call is raised, and consequently, the programming of the second bit of the cell is slower.

In NROM cells, in addition to the stated problems connected with breakdown of the oxide layer and unnecessary dissipation of power, over-programming creates different problems. As explained below in connection with FIGS. 6, over-programming results in quality deterioration and reliability degradation, as well as read failures in two-bit cells.

FIGS. 6A, 6B, 6C and 6D, to which reference is now made, are exploded views of the NROM cell depicted in FIGS. 2A and 2B. It is noted that the shape of the trapped charge in chargeable areas 106 and 108 range from a narrow pocket, depicted as 106N and 108N, to an average pocket (i.e. 106A and 108A), to an even wider pocket (i.e. 106W and 108W) with a "tail" 44.

Applicants note that tail 44, which is farther from the bit line than the bulk of the trapped charge, is generally not removable during erasure and thus, reduces the ability of the NROM cell to withstand a large number of program and erase cycles. Typically, erasure depletes only the charge concentration closest to the diffusion area. Thus, if the distribution pocket is too wide, the tail 44 of the trapped charge will not erase, and with each progressive erase, more and more charge will remain in the retention section, even after erasures (FIG. 6D).

The trapped charge in tail 44 acts as partially programmed charge. It is due to the trapped charge in tail 44 that fewer programming pulses are required to achieve the programmed threshold voltage level (since the bit is already, in effect, partially programmed).

Furthermore, the accumulation of trapped negative charge far from the junction increases the threshold voltage level, which affects the reverse read, making it difficult to distinguish the first bit from the second bit and creating read failures. In order to compensate, the erase operation accumulates extra positive charge close to the junction, which makes the erase time take longer.

Unfortunately, prior art methods of gradually increasing the programming gate voltage $V_G$ are not effective for NROM cells, and tend to produce the following two problems:

1. In NROM products, increases in the gate voltage $V_G$ do not linearly correlate to increases in the threshold voltage $V_{TH}$, and the effect of the increases varies from cell to cell. This causes a lack of precise programming control, and an incurred risk of over programming.

2. In order to ensure a reasonable yield rate, meeting the programming rate requirement, the drain voltage $V_D$ potential must be high, creating trapped charge regions distant from the junction.

The above two problems result in reduction in the endurance of the product, increase in the charge loss and reduction in yield.

In regard to the first problem, reference is now made to FIG. 7, an electrical schematic of a portion of an NROM array. The depicted circuit includes a bit line power supply $V_{PPS}$, a select transistor 152, resistors R1 and R2, and an NROM cell 154. Resistors R1 and R2 denote the native resistance of the wire in the depicted array. Transistor 152 is a select transistor used to select a bit line of the array. Programming current $I_{PR}$ flows throughout the entire circuit. The voltage drops across the channels of transistor 152 and cell 154 are designated as $V_{DS\text{-}SEL}$ and $V_{DS}$, respectively.

In NROM cells, small increases in the programming gate voltage $V_G$ greatly influences the programming current $I_{PR}$. In a chain reaction effect, when the programming gate voltage $V_G$ is stepped, programming current $I_{PR}$ increases, which causes an increase in voltage drops $V_{DS\text{-}SEL}$ and $V_{DS}$ and an increase in the voltage drops along resistors R1 and R2. Hence, with all the different factors changing, there is no clear linear relationship between the stepped gate voltage $V_G$ and the threshold voltage $V_{TH}$, and therefore, no precise control over the programming process. As a further complication, the reduction in $V_{DS}$ increases the programming time exponentially.

Reduction in the incremental increase of the gate voltage $V_G$ can alleviate part of the control problem, but it will dramatically increase the programming time. Further control improvement can be achieved by increasing the dynamic range of the gate voltage $V_G$. Unfortunately, there are resultant difficulties at both ends of the dynamic range.

Low gate voltage $V_G$ results in cycling degradation. So therefore, the desired gate voltage $V_G$ is set relatively high, i.e. 8–10V. Further increases in gate voltage $V_G$, such as over 10V, require special processes and put severe limitations on the scaling of the ONO thickness due to charging by tunneling. For example, a 180 Å ONO of the 0.5 process will experience tunneling charging for voltages over 12V.

The second problem noted above (high drain voltage $V_D$) creates even more severe limitations on the stepped gate voltage $V_G$ approach. When programming according to stepping of the gate voltage $V_G$, the programming drain voltage $V_D$ must be fixed and high in order to cover a large dynamic range. Using a high programming drain voltage $V_D$ creates a large lateral field and a wide pinch-off regime, yielding a wide trapped charge region. Accordingly, the resultant product is the undesirable tail 44, which drastically reduces the product's endurance.

Hence, due to the first problem noted above, using the gate voltage $V_G$ as a dynamic parameter for controlling programming is very limited in range.

In conclusion, in NROM cells, stepping the programming gate voltage $V_G$ does not provide tight programming control and is not effective in preventing over-programming and eventual degradation of the product's quality.

As can be understood from the above, when prior art programming algorithms are applied to the NROM cell, they do not sufficiently provide the abilities to produce increased programming speed while maintaining tight programming control. Applicants have found a need for an NROM programming algorithm which executes these functions over a wide range of programming parameters, thus avoiding the dangers of over-programming and its resultant reduction in product reliability.

SUMMARY

It is thus an object of the present invention to provide a method for programming of NROM sells with improved programming control and programming speed.

There is therefore provided, in accordance with a preferred embodiment of the present invention, a method for programming an NROM cell. The method includes the steps of applying a drain, a source and a gate voltage to the cell and verifying a programmed or a non-programmed state of the cell. If the cell is in the non-programmed state, the method includes the steps of increasing the drain voltage and maintaining the gate voltage at a constant level during at least a part of the step of increasing. The steps of applying, verifying, increasing and maintaining are repeated until the cell reaches the programmed state.

Preferably, the step of repeating occurs 3–7 times.

There is therefore provided, in accordance with a preferred embodiment of the present invention, a method for controlling the programming time of an NROM cell. The method includes the same steps as listed above.

Preferably the step of increasing also includes stepping the drain voltage, where the steps are executed in non-linear steps or equal amplitude steps. Equal amplitude step produces an equivalent step in a threshold voltage of the NROM cell The steps may also be executed in steps of equal time duration or steps of unequal time duration.

The method preferably also includes dialing in an initial drain voltage. Preferably, the step of maintaining includes changing the gate voltage at least once or maintaining the gate voltage constant throughout the step of increasing.

The step of applying preferably includes applying a maximum gate voltage to the gate and/or beginning the drain voltage at a low voltage level.

There is therefore provided, in accordance with a preferred embodiment of the present invention, a method for programming of an NROM cell having two diffusion areas and a channel therebetween. The method includes the steps of:

controlling a voltage across the channel during programming:

verifying a programmed or a non-programmed state of the cell; and repeating the steps of controlling and verifying until the cell reaches the programmed state.

There is therefore provided, in accordance with a preferred embodiment of the present invention, a method for programming of an NROM cell having two diffusion areas and a channel therebetween. The method includes the steps of:

maintaining a constant current in the channel during programming;

verifying a programmed or a non-programmed state of the cell; and repeating the steps of controlling and verifying until the cell reaches the programmed state.

There is therefore provided, in accordance with a preferred embodiment of the present invention, a method for confining charge within a predefined region of a retention layer of an NROM cell having a gate. The method includes the steps, during programming, of applying an incrementally increasing drain voltage to a diffusion area acting as a drain of the cell and maintaining a constant gate voltage on the gate during at least a part of the step of applying and verifying a programmed or a non-programmed state of the cell. If the cell is in the non-programmed state, the steps of applying, maintaining and verifying are repeated until the cell reaches the programmed state.

There is therefore provided, in accordance with a preferred embodiment of the present invention, a method for retaining charge in an NROM cell having a gate and a retention layer. The method includes the steps of confining the charge within a predefined region of the retention layer of the cell by executing the steps outline above.

There is therefore provided, in accordance with a preferred embodiment of the present invention, a method for retaining charge in an NROM cell having a gate and a retention layer. The method includes the steps of providing a compact spatial charge distribution within a predefined region of the retention layer of the cell by executing the steps outline above.

A method for retaining the separation distance between two charge regions in an NROM cell having a gate and two diffusion areas, the method; includes the steps of, for each charge region, executing the steps outline above.

Preferably the predefined region or the charge regions, as applicable,. are close to the diffusion area.

There is therefore provided, in accordance with a preferred embodiment of the present invention, an NROM cell having charge retained by the method described above.

There is therefore additionally provided, in accordance with a preferred embodiment of the present invention, a charge distribution as created by method described above.

There is therefore provided, in accordance with a preferred embodiment of the present invention, an NROM cell including a retention element, two diffusion areas, one on either side of the retention element, and at least one compact spatial charge distribution within the retention element and near at least one of the diffusion areas, as created by the method described above. The charge distribution is removable in generally its entirety.

There is therefore provided, in accordance with a preferred embodiment of the present invention, a method for controlling a change in the threshold voltage of an NROM cell wherein the cell receives a drain, a source and a gate voltage. The method comprising the step, during programming, of varying said drain voltage while keeping said gate voltage at at least one constant level.

There is therefore provided, in accordance with a preferred embodiment of the present invention, a method for programming an array of NROM cells having varying programming speeds. The array has bit lines and word lines, and the method includes the steps of providing a gate voltage to one of the word lines, providing a source voltage to a first bit line and a drain voltage to a second bit line, and varying the drain voltage while keeping the gate voltage at a constant level until the array of cells reach saturation.

BRIEF DESCRIPTION OF THE DRAWINGS

The present invention will be understood and appreciated more fully from the following detailed description taken in conjunction with the drawings in which.

DETAILED DESCRIPTION

The present invention teaches an NROM cell algorithm which regulates the bit line voltage $V_{BL}$ provided to the bit line acting as the drain, thereby providing tight programming control, Furthermore, the described invention provides the combination of a fast programming algorithm with reduced over-programming risk, and hence improved product endurance and cycling ability.

Although a bit line can act as either a source or a drain, in the present application, references to the bit line voltage $V_{BL}$ refer to the voltage produced to the situations when the bit line currently acting as a drain. For purposes of clarity herein, when the bit line acts as a source, it is herein referred to as a source.

The present invention further teaches the use of a low programming bit line voltage $V_{BL}$ to produce a tight spatial distribution of trapped charge, thereby resulting in better two-bit separation in the NROM cell, faster erase, and increased product life.

Figure 8A:
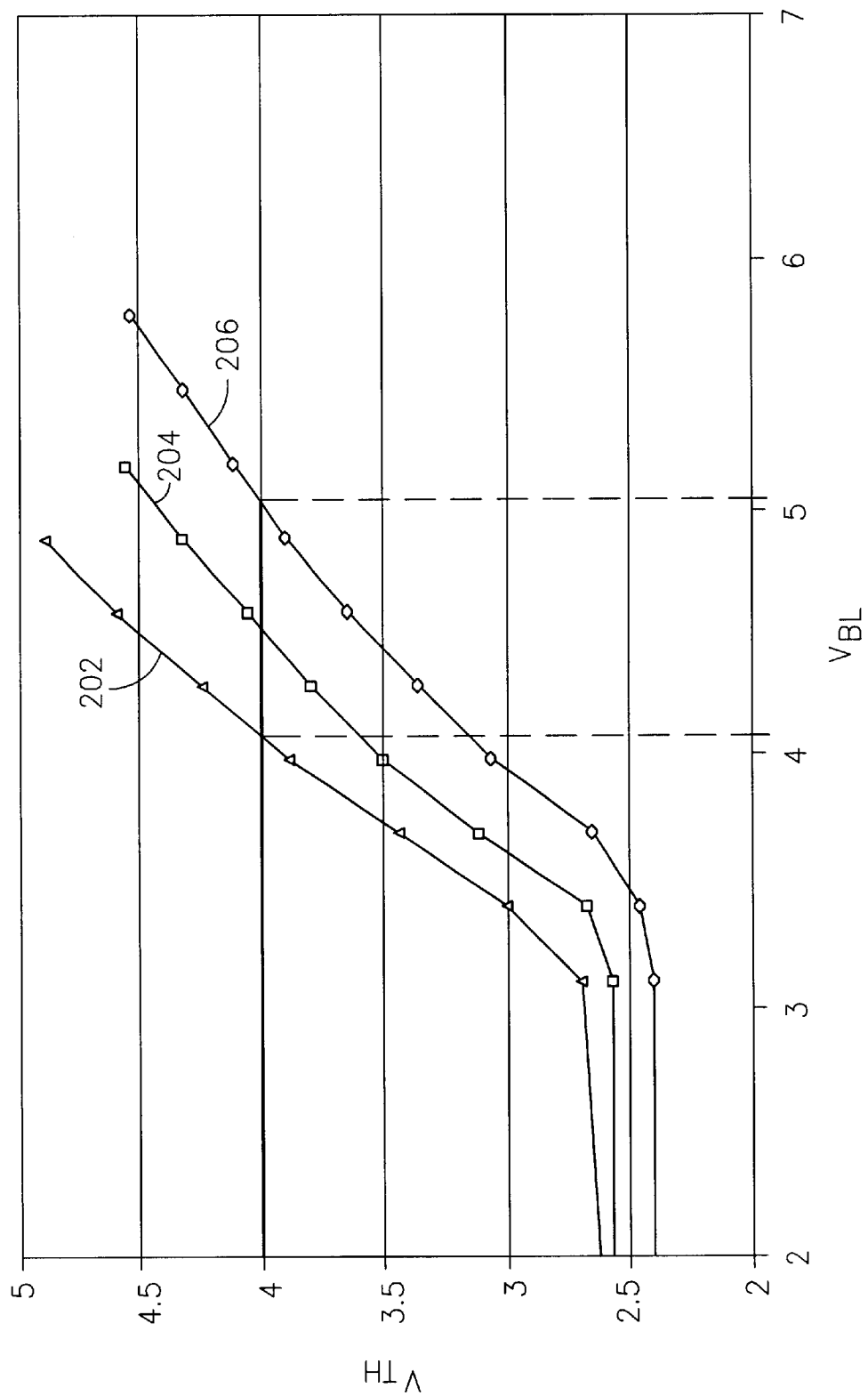
FIGS. 8A, 8B and 8C are graphs illustrating the effect of programming drain voltages on the threshold voltage, as a function of cell temperature, channel length, and array/second bit effects, respectively.
Figure 8B:
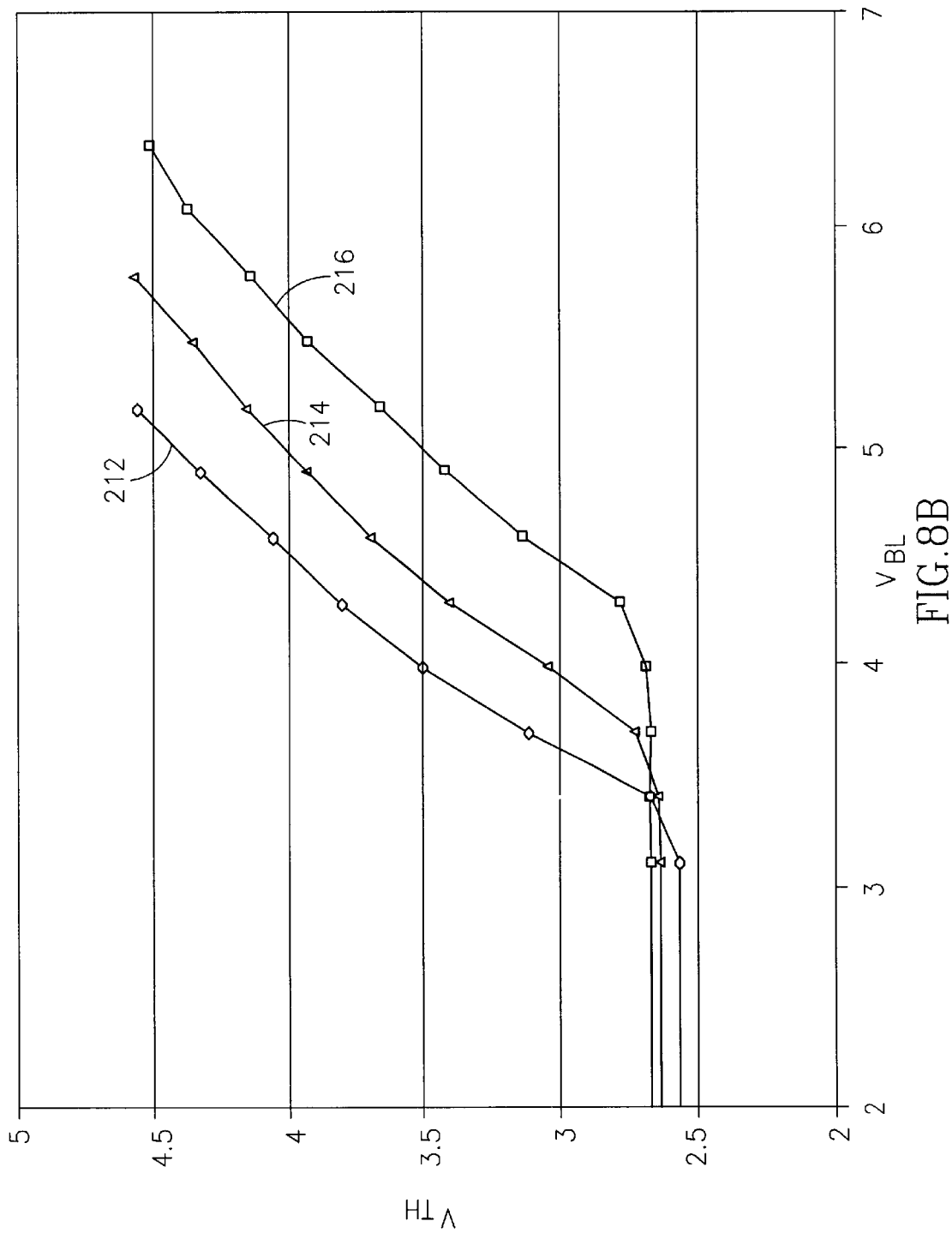
Figure 8C:
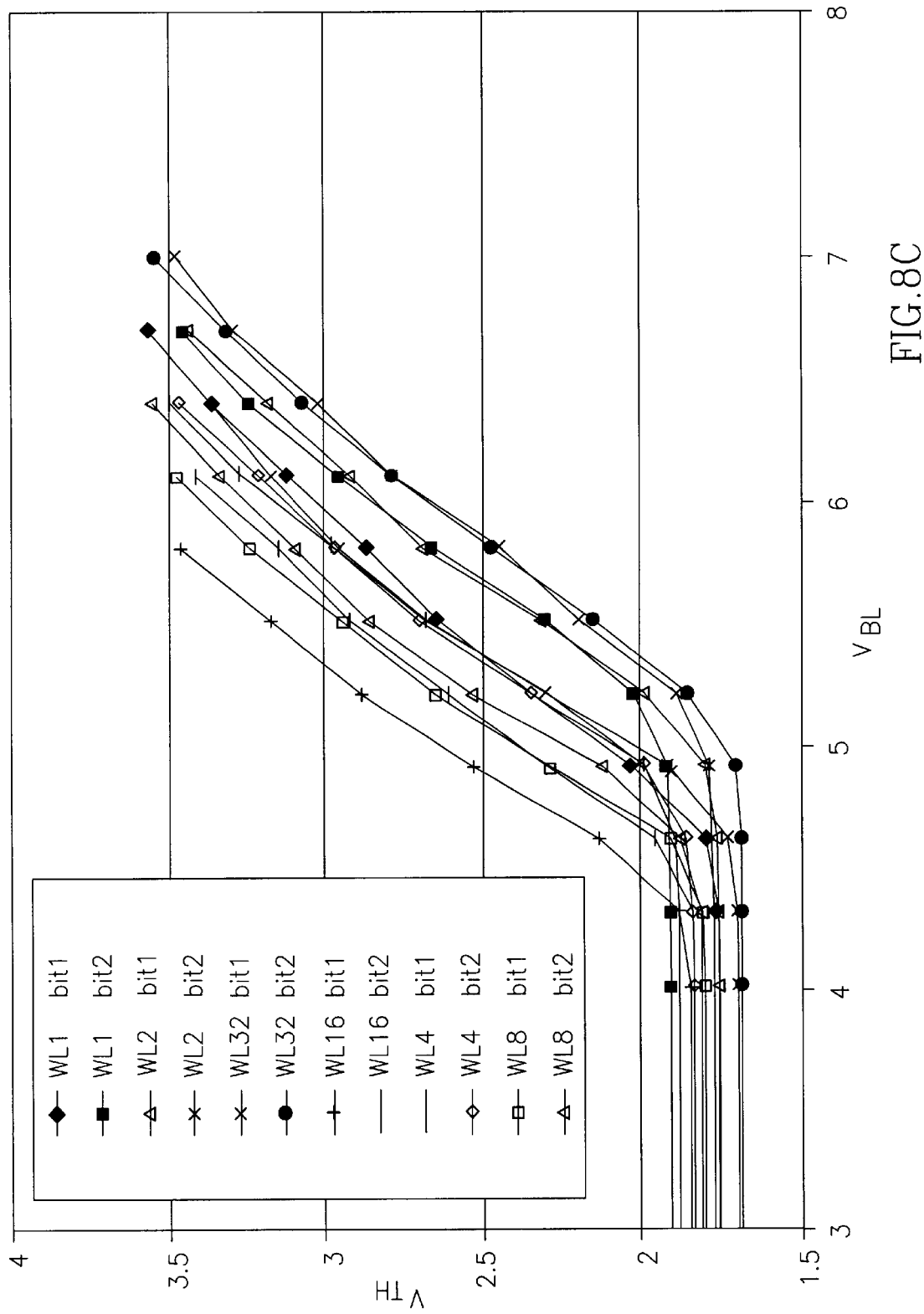

Furthermore, by controlling the bit line voltage $V_{BL}$, the present invention provides a fast and generally accurate programming algorithm for a large distribution of cells with diverse process variations and programming times. Reference is now made to FIGS. 8A–C, a series of graphs that illustrate the effect of the programming bit line voltage $V_{BL}$ on threshold voltage $V_{TH}$ as a function of cell temperature, channel length, and array effects/second bit, respectively, In this graph the reverse read threshold voltage $V_{TH}$, which is the threshold voltage $V_{TH}$ when the cell is reverse read, is a function of bit line voltage $V_{BL}$. Every point represents a programming pulse of 2 μsec in exemplary steps of 0.3V. It is noted that the gate voltage $V_G$ is constant at 9V.

The graph in FIG. 8A illustrates 3 programming curves for three varying cell temperatures: curve 202 denotes a cell at −40° C., curve 204—a cell at 20° C., and curve 206—a cell at 80° C. As seen in the figure, in order to achieve a specific threshold voltage $V_{TH}$, each cell receives a different drain voltage $V_D$, depending on the temperature of that specific cell. As an example, to achieve a desired threshold voltage $V_{TH}$ of approximately 4V, the low temperature case (curve 202) receives a bit line voltage $V_{BL}$ of approximately 4.1V, while the high temperature case (curve 206) must receive a bit line voltage $V_{BL}$ potential of 5V to reach the same desired threshold voltage $V_{TH}$ level. Accordingly, in a preferred embodiment, the bit line voltage $V_{BL}$ is incrementally increased from a minimum voltage to a higher voltage, thus covering a wide range of operating temperatures.

When a cell has reached the desired threshold voltage $V_{TH}$, such as 4V, the programming algorithm for that cell is terminated. Meanwhile, for cells which have not yet reached the desired threshold voltage, the bit line voltage $V_{BL}$ is incrementally increased, until those cells have reached their desired level. Thus, referring to the example above, when operating at a low temperature (curve 202), the cell will complete programming at a bit line voltage $V_{BL}$ of 4.3V, while if operating at high temperatures (curve 206), the cell will complete programming at a bit line voltage $V_{BL}$ of approximately 5V. It is noted that for curves 202 and 206, the bit line voltages $V_{BL}$ of 4.3V and 5V, respectively, are the first bit line voltage levels that result in a threshold voltage $V_{TH}$ higher than the exemplary target of 4V.

It is also apparent from FIG. 8A that the chosen step size for the bit line voltage $V_{BL}$ affects the size of the maximum overshoot (over-programming) of the threshold voltage $V_{TH}$. In order to achieve a very accurate bit line voltage $V_{BL}$ rise, it is preferable that the step size is relatively small. Thus to receive the programming level, the resultant algorithm requires many programming steps and may result in extended programming times. Conversely, a large voltage step results in quicker programming times however, opens up to the risk of a large overshoot. The practical step size is a compromise between the requirements for quick programming speed and limited overshoot.

It is noted that, when observing the section of the graph commencing at a bit line voltage $V_{BL}$ of 3V, although the absolute rise of the curves may differ, the slopes of the curves are essentially equivalent, and approximately linear. Consequently, for each step in the bit line voltage $V_{BL}$, there is an equivalent step in the threshold voltage $V_{TH}$, regardless of the temperature of the cell.

Thus, for a known incremental increase in drain voltage $V_D$, it is possible to gauge the incremental increase in threshold voltage $V_{TH}$. Knowing this information allows for more precise programming abilities and a greater protection against over-programming, with all the detrimental affects associated therewith.

FIG. 8B is comparable to the graph of FIG. 8A and depicts the effect of the of the bit line voltage $V_{BL}$ on the reverse read threshold voltage $V_{TH}$ as a function of a channel length of 0.6 $\mu$m, 0.65 $\mu$m and 0.7 $\mu$m respectively, for curves 212, 214, and 216, respectfully. FIG. 8C depicts the effect of the of the bit line voltage $V_{BL}$ on the reverse read threshold voltage $V_{TH}$ as a function of the location of a cell along a 32 bit long local diffusion bit-line segment and a comparison between the $1^{st}$ and $2^{nd}$ bit of the same cell. The fastest bit is bit 1 of word-line 16 and the slowest is bit 2 on word-lines 32 and 2. In order to reach a threshold voltage $V_{TH}$ of 3.5V, the fastest bit receives a bit line voltage $V_{BL}$ equal to approximately 5.8V, and the slowest, receives approximately 7V.

As was noted in FIG. 8A, and bringing attention to a similar phenomenon in FIGS. 8B and 8C, although the characteristics of the represented cells differ, the programming slope is generally equivalent and generally linear. Hence, the explanation as outline above for FIG. 8A is also applicable to these figures, and the conclusions drawn for FIG. 8A are also applicable to FIGS. 8B and 8C.

Consequently, for an array of cells with a wide divergence of process and/or environmental conditions, by stepping the bit line voltage $V_{Bl}$, it is possible to achieve a controlled programming algorithm with an accurate prediction of the delta threshold voltage $V_{TH}$ rise.

Figure 9:
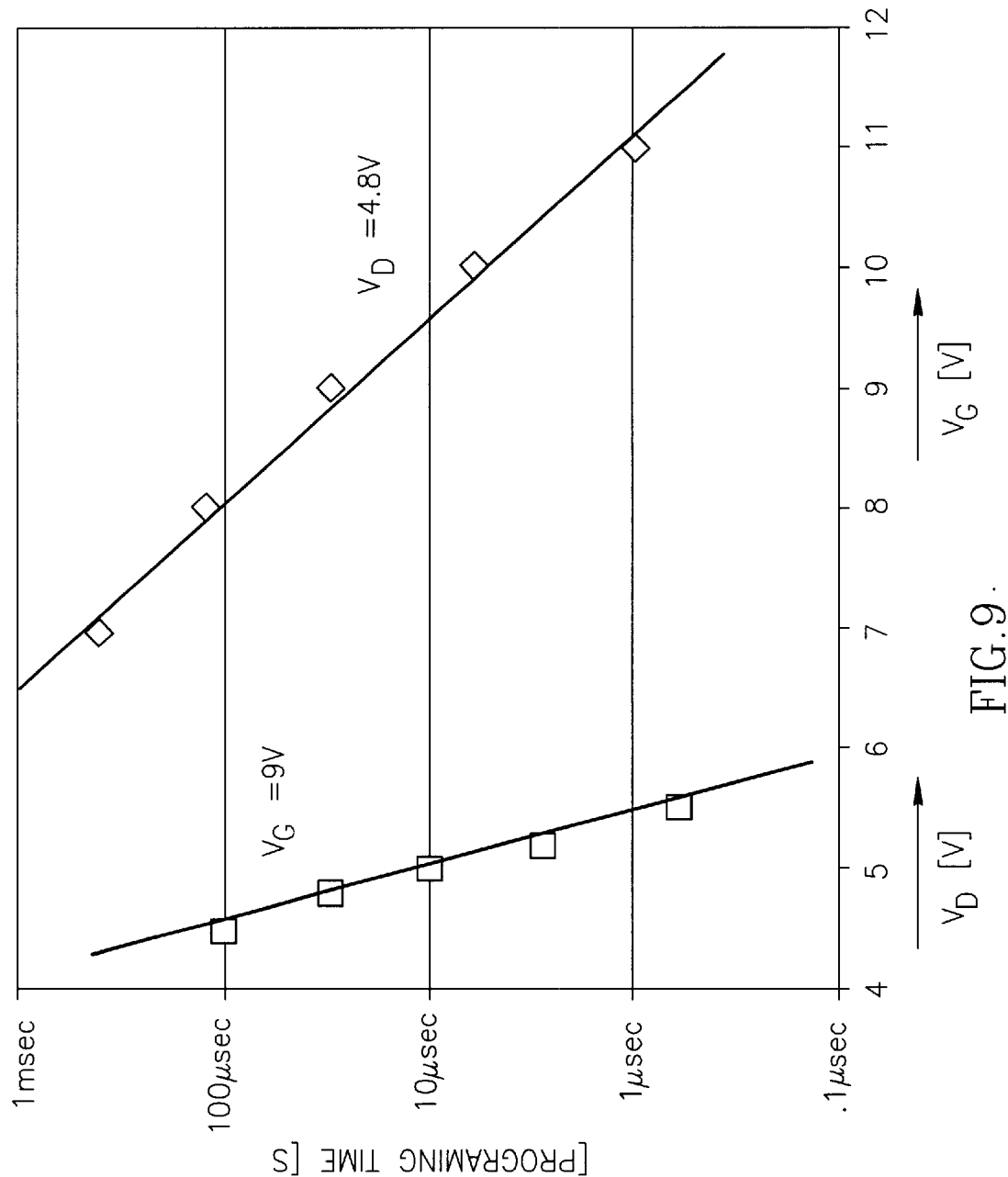
FIG. 9 is a graph illustrating the effect of the gate voltage and the drain voltage on the threshold voltage.

Although it is possible to cover a diverse range of programming variations by stepping the gate voltage $V_G$, as was done in prior art floating gate algorithms, in NROM cells, drain voltage V stepping is more efficient. Reference is now made to FIG. 9, a graph illustrating the programming time of an exemplary cell (channel length=0.65 $\mu$m, temperature=20C.) as a function of either drain voltage $V_D$ or gate voltage $V_G$.

When programming with a constant gate voltage $V_G$ and a stepped drain voltage $V_D$ between 4.5V to 5.5V, the resultant programming times range from of 100$\mu$ sec down to 0.8$\mu$ sec. respectfully. However, in order to achieve approximately the same programming time range with a constant drain voltage $V_D$, the gate voltage must be stepped from 8V to 11.5V. Thus, in the NROM cell, in order to cover an equivalent range of programming times, a 1V step in drain voltage $V_D$ is equivalent to a 3.5V step in gate voltage $V_G$.

As further noted and depicted in FIG. 9, when stepping the gate voltage $V_G$, in order to catch the fast programming cells without risking over-programming, the resultant programming algorithm must commence with a low potential for the gate voltage $V_G$. This, however, is undesirable since it causes programming to be slow. Hence, in order to increase the programming speed, the low gate voltage $V_G$ must be paired with high drain voltages $V_D$.

Nonetheless, as noted in the previous sections, high drain voltages $V_D$ promote cell degradation and decreased cycling ability. Unequivocally, high drain voltages $V_D$ in combination with a low gate voltages $V_G$ are even more detrimental to the cell, producing very large lateral fields and wide pinch-off regions, yielding an extensive trapped charge region.

In contrast, in the present invention, in order to capture the fast programmers, the inventive programming algorithm commences with a low drain voltage $V_D$, and a high gate voltage $V_G$. This is favorable since applying a high programming gate voltage $V_G$ and a low drain voltage $V_D$ imposes a large vertical field and a narrow pinch-off regime, thus resulting in a narrower trapped electron pocket.

It is also noted that although some of the present embodiments depict maintaining a constant gate voltage $V_G$ through the programming algorithm, alternatively, it is possible to maintain a constant gate voltage $V_G$ for a portion of the algorithm, and apply one or more constant gate voltages for the remainder of the algorithm. This is particularly useful after application of the first or second programming pulse, at which point the gate voltage $V_G$ is increased once.

Figure 1:
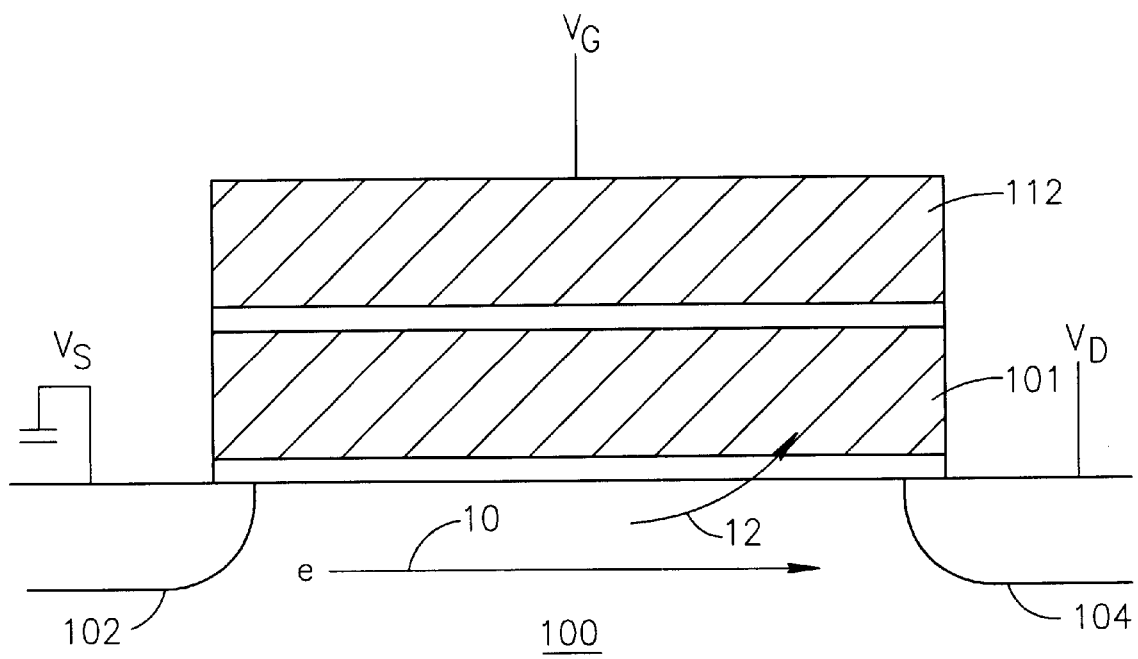
FIG. 1 is a schematic illustration of a floating gate memory cell.
Figure 2A:
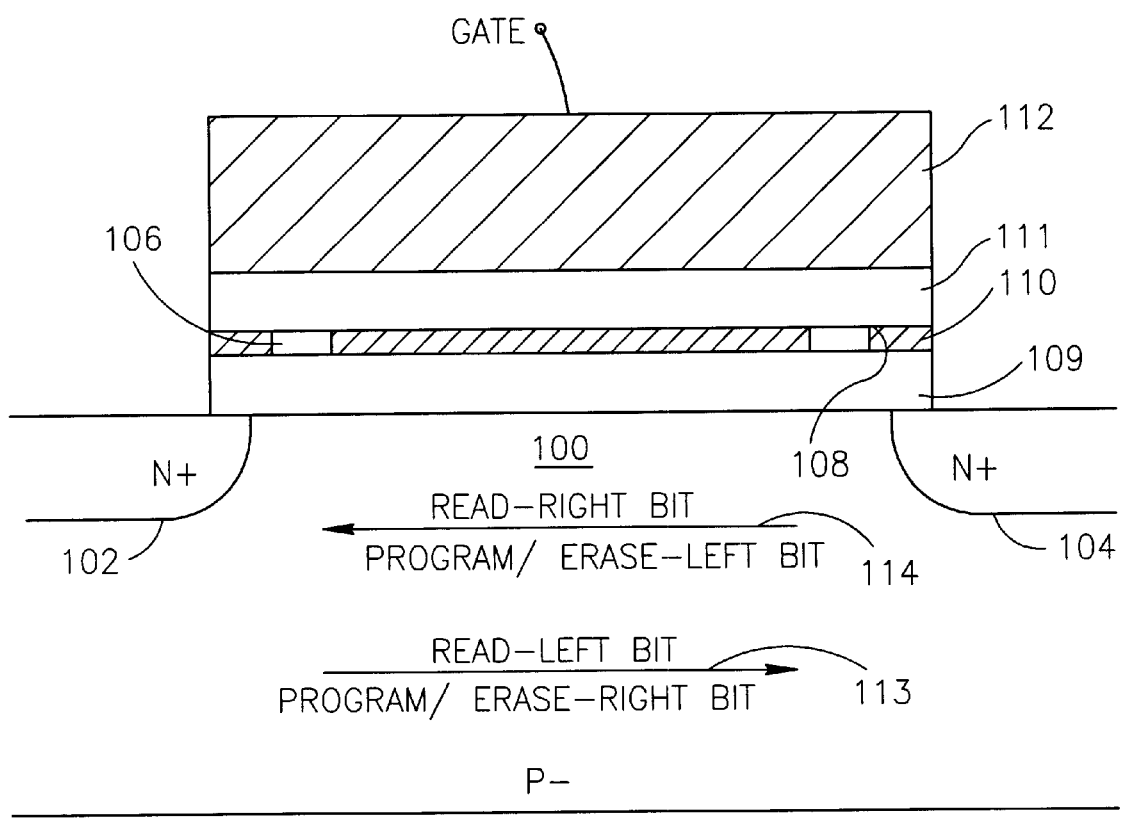
FIG. 2A and 2B are schematic illustrations of a NROM memory cell.
Figure 2B:
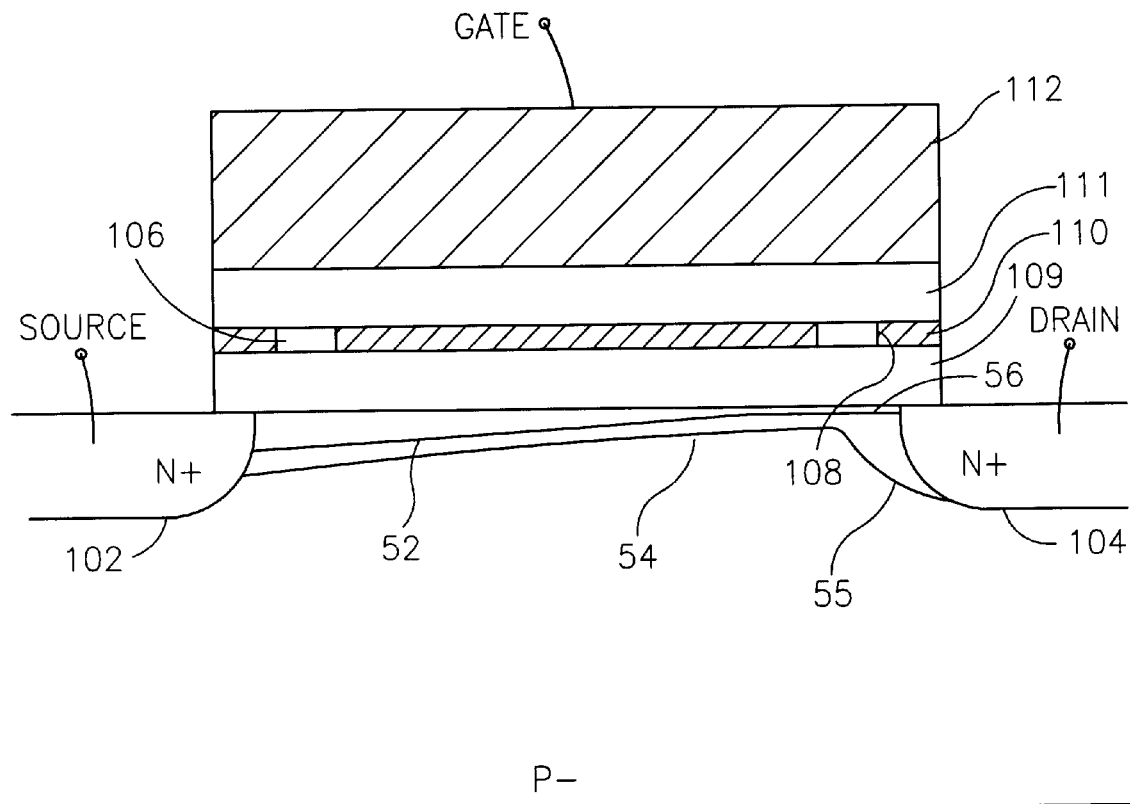
Figure 3A:
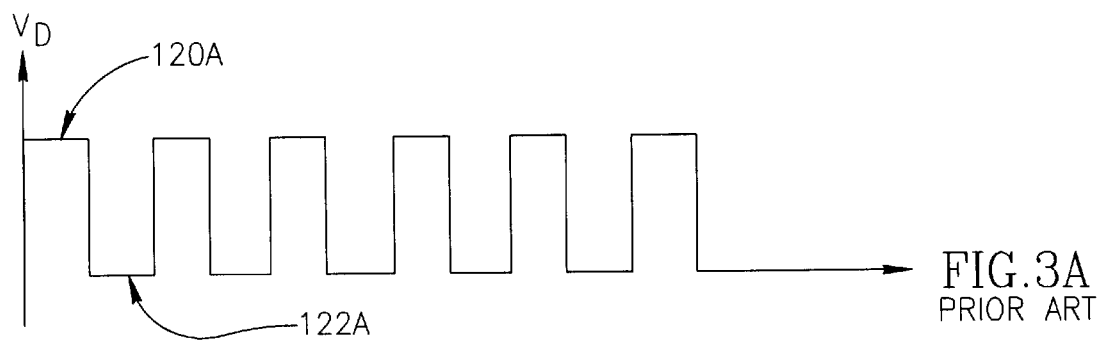
FIGS. 3A, 3B and 3C are graphical illustrations of a prior art programming scheme.
Figure 3B:
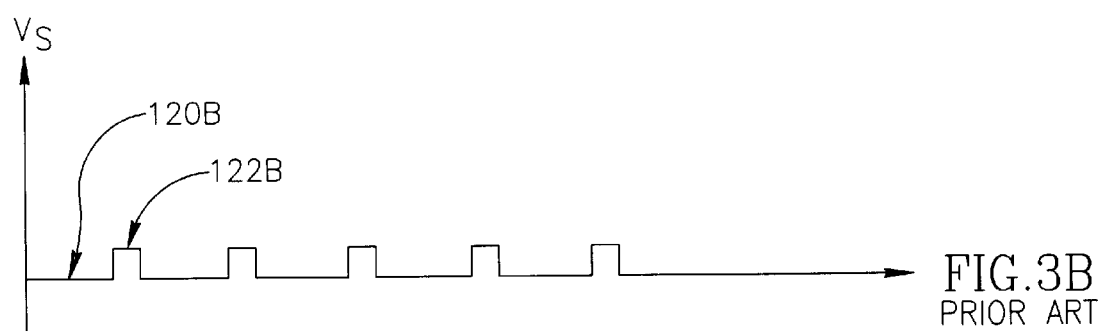
Figure 3C:
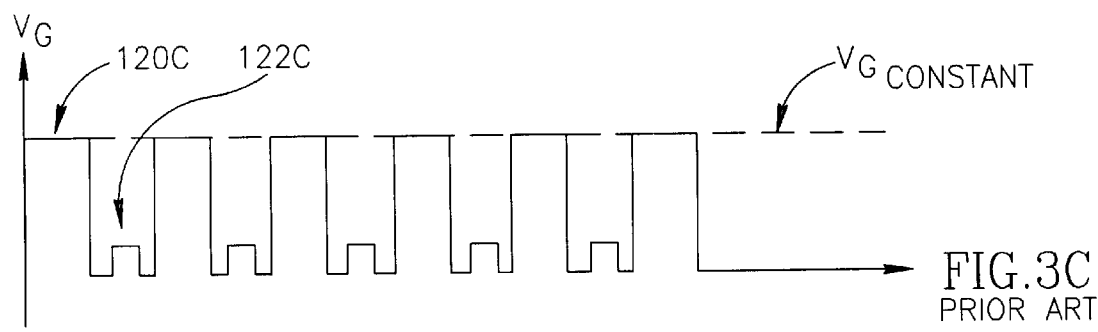
Figure 4:
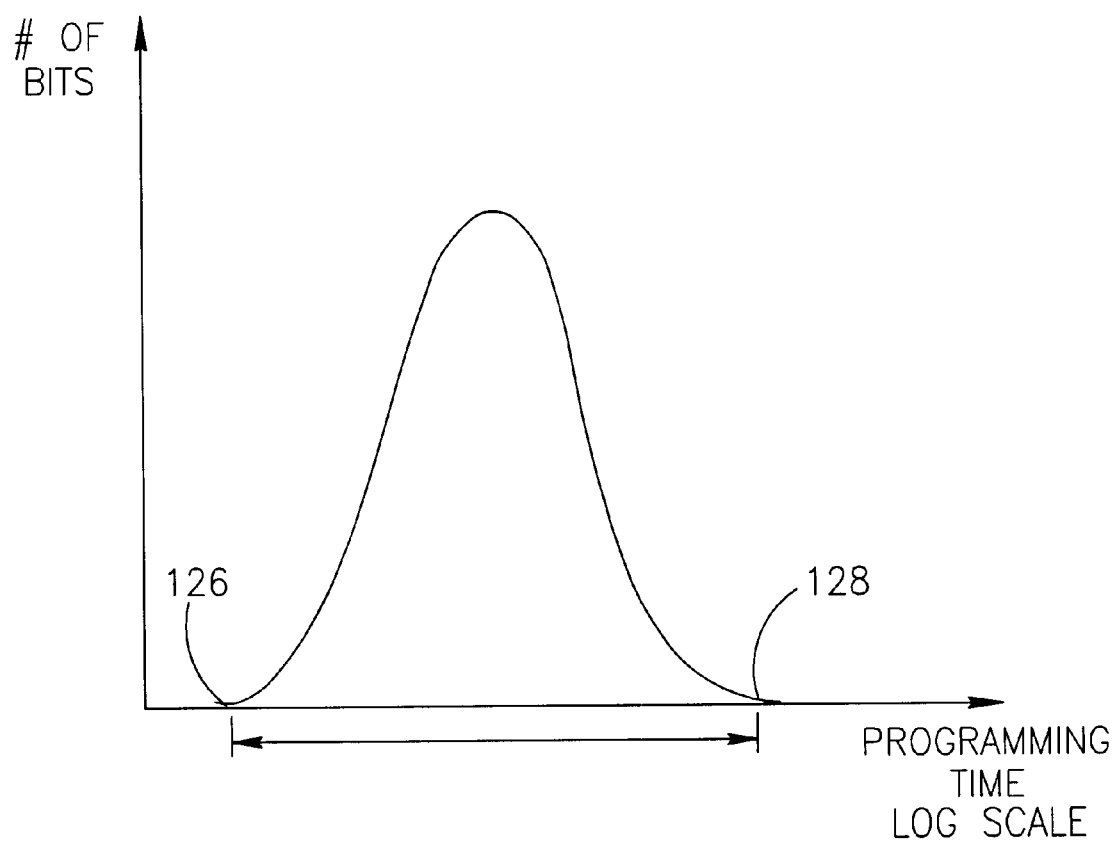
FIG. 4 is a histogram of the distribution of programming speed in NROM memory cells.
Figure 5:
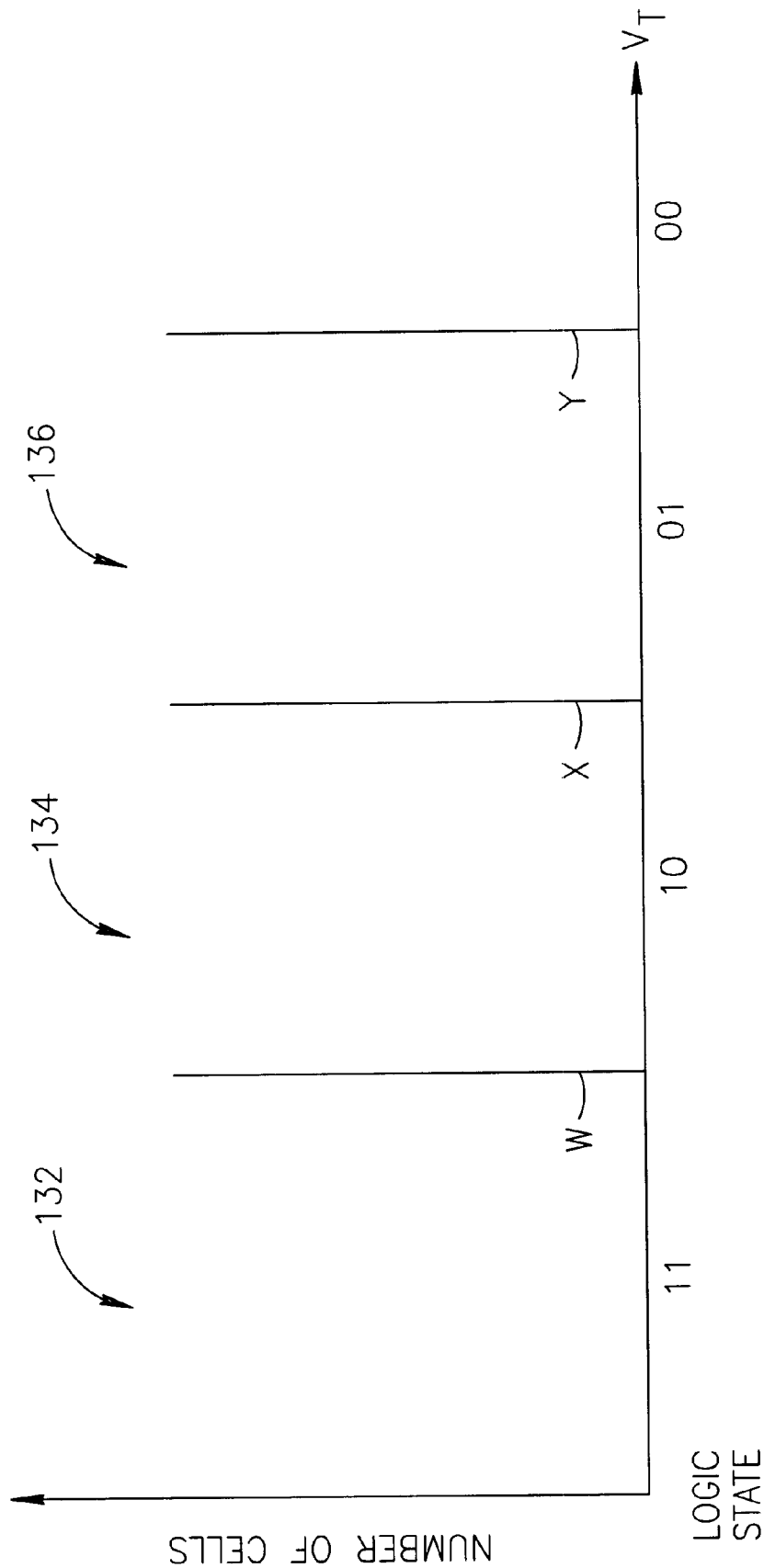
FIG. 5 is a graph of the charge levels in a multi-level floating gate cell.
Figure 6A:
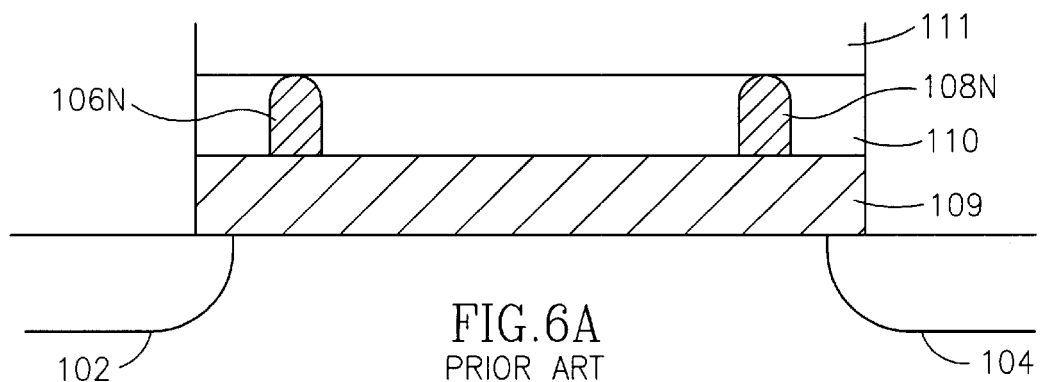
FIGS. 6A, 6B, 6C and 6D are schematic illustrations of trapped charge retained in a two-bit NROM memory cell.
Figure 6B:
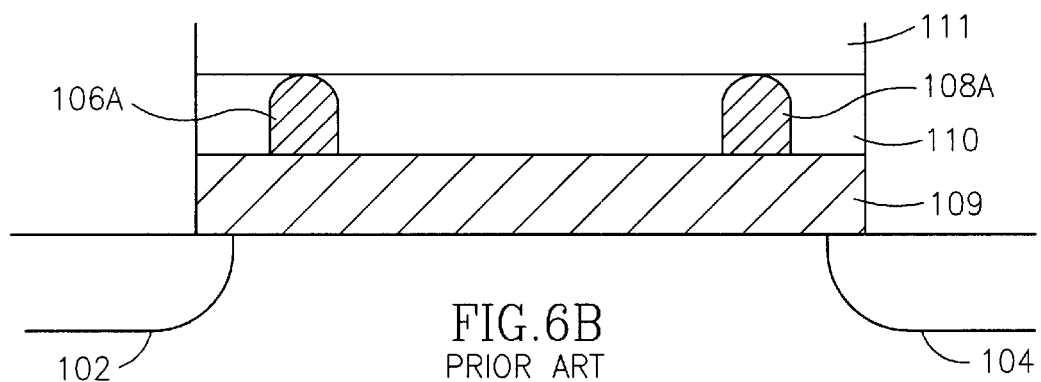
Figure 6C:
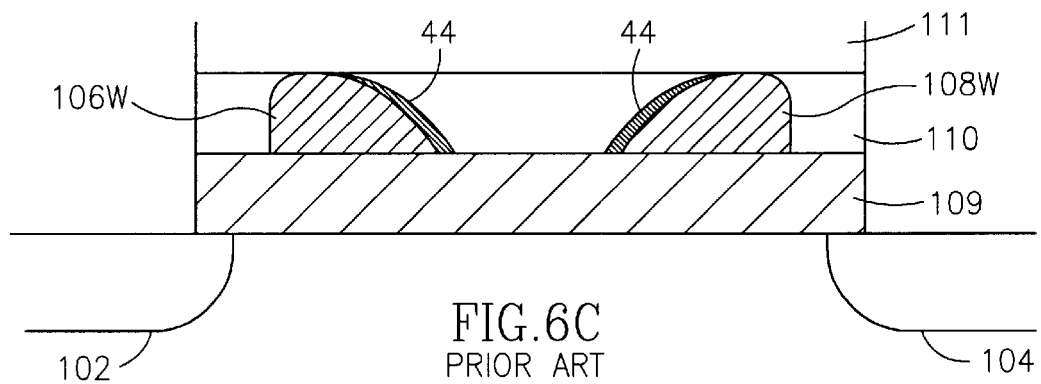
Figure 6D:
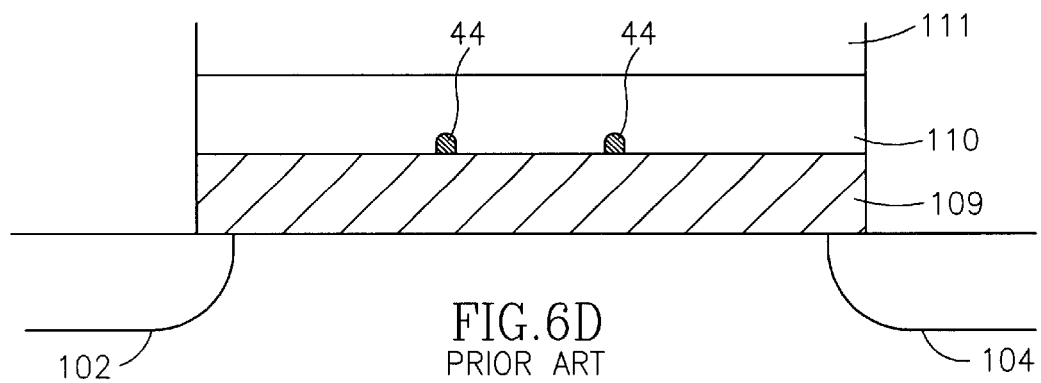

In order to explain the present invention in more detail reference is now made again to FIGS. 2A and 7. As noted above (FIG. 2A), in NROM cells the charge is trapped in a localized region and the read process is a reverse read. As such, the programming current $I_{PR}$ is generally insensitive to the rise in threshold voltage $V_{TH}$, and remains constant even during programming.

The programming current is fixed during programming since the cell is programmed in the forward direction, which causes the charge to be trapped next to the drain. Hence, during reading, there is full punch-through under the localized charge. Additionally, for each increase in the threshold voltage $V_{TH}$, the charge is punched through at a greater distance from the junction.

Figure 7:
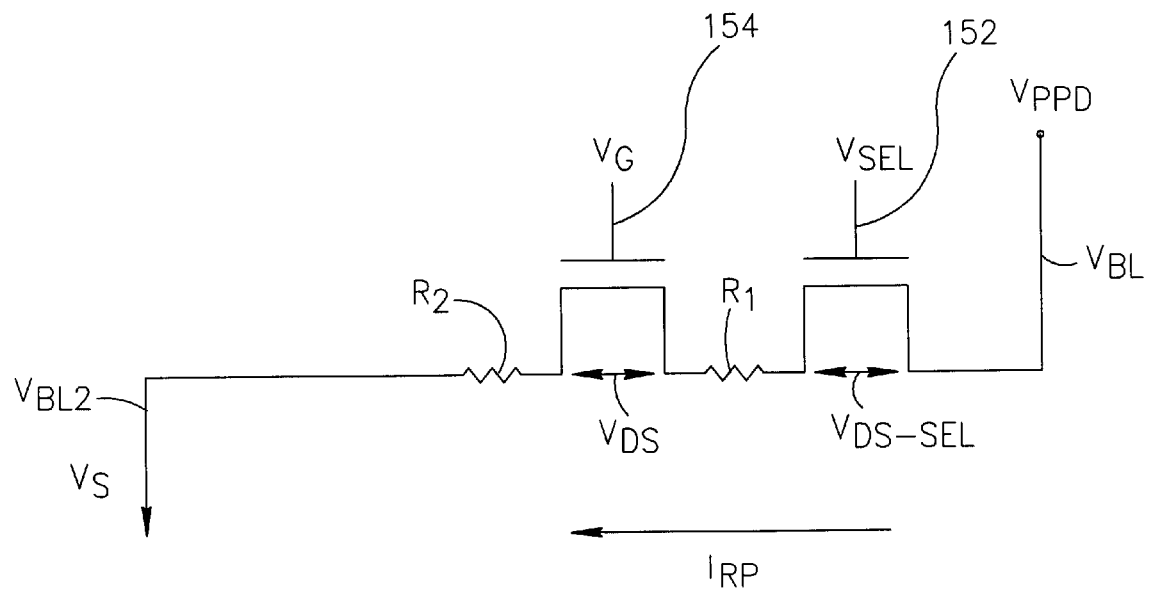
FIG. 7 is an electrical schematic illustration of a portion of an NROM array.

Hence, $$\alpha V_{DS} = \alpha \Delta V_{TH} = V_{BL} - V_{BL-S} \qquad (1)$$

where $V_{BL-S}$ is the bit line voltage for the source and is constant, and

α is a constant proportionally between 0.5 and 2, and is affected by parameters such as channel length, gate voltage $V_G$, temperature, and location of the cell in the array. Referring now to FIG. 7, the IR loss equation that defines the circuit depicted therein is:

$$V_{PS}=V_{DS}=V_{DS\text{-}SEL}+(R_1+R_2)*I_{PR} \quad (2)$$

Since the programming current $I_{PR}$ is constant, then the IR losses across $V_{DS\text{-}SEL}$, $I_{PR}$ and R1 and R2 are also constant. Consequently, the only remaining nonconstant factor is the channel voltage $V_{DS}$. Thus $$\Delta V_{PSS}=\alpha\Delta V_{DS} \quad (3)$$

Thus, since $V_{BL2}$ is constant, when combining equations (1) and (3)

$$\Delta V_{PS}\equiv\Delta V_{BL}=\alpha\Delta V_{TH} \quad (4)$$

or, since $V_{BL}$ is equivalent to $V_D$ $$\Delta V_D=\alpha\Delta V_{TH} \quad (5)$$

Evidence to such can also be seen when observing the linear sections of FIGS. 8A–8C, and as explained hereinabove in reference to those graphs. Consequently, when considering this linear relationship, applicants have concluded that closely controlling the drain voltage $V_D$ produces a known change in the threshold voltage $V_{TH}$, and thus the programming algorithm of the present invention provides precise control over the programming procedure, including preventing over-programming.

Figure 10:
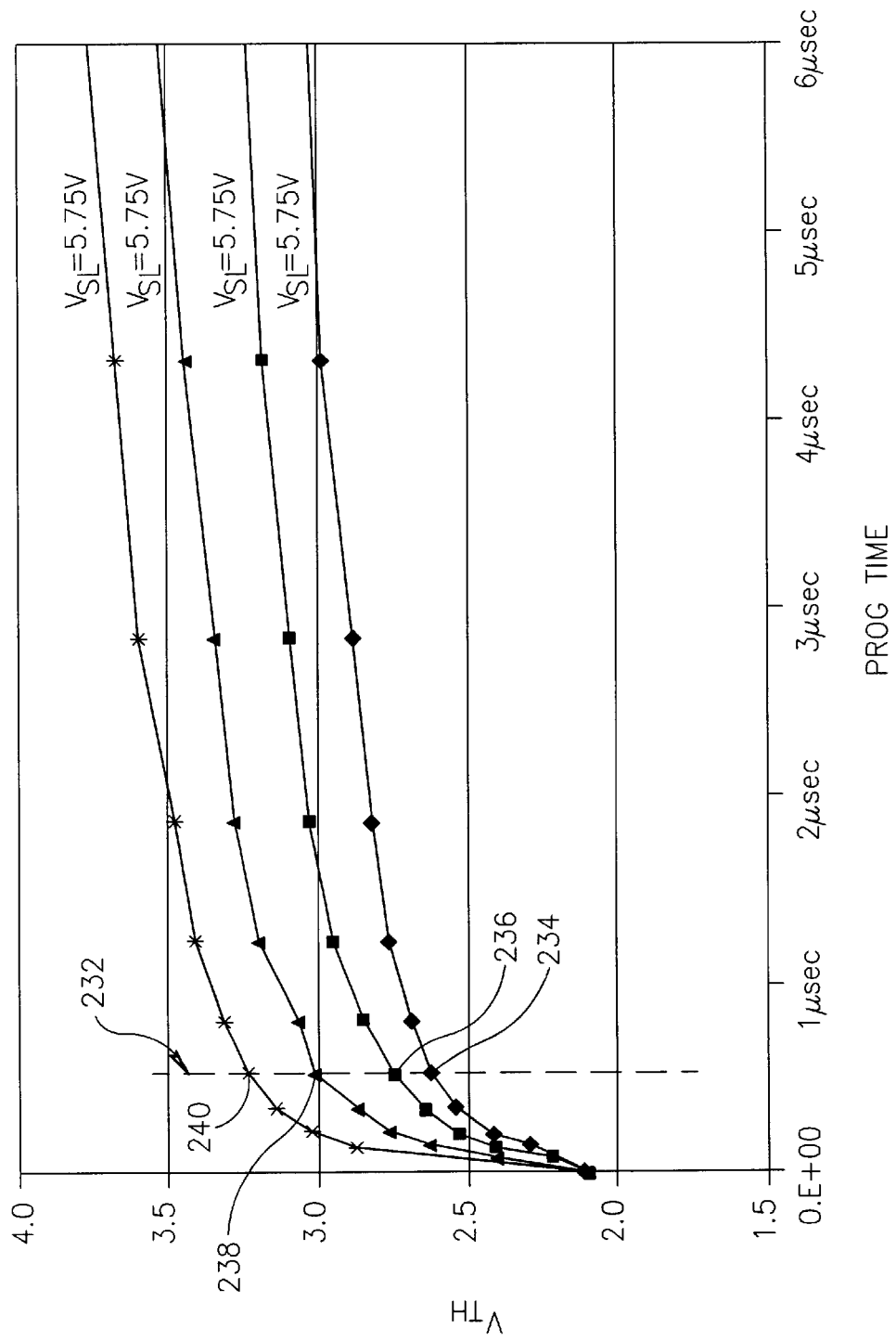
FIG. 10 is a graph illustrating the increases in the threshold voltages over time, as a function of the drain voltage.

Reference is now made to FIG. 10, a graph illustrating the rise in threshold voltage $V_{TH}$, as a function of time, with the bit line voltage $V_{BL}$ as a parameter. Depicted in FIG. 10 the resulting threshold voltage $V_{TH}$ for 4 exemplary drain voltages of 5V, 5.25V, 5.5V and 5.75 V, respectively.

As can be observed in all of the curves, the threshold voltage $V_{TH}$ rises quickly at the start of the curve, and then reaches a point where the increase in threshold voltage $V_{TH}$ i is saturated. The flatter region of the curve, to the right of dashed line 232, illustrates the region wherein the cell programming has saturated and subsequent programming pulses have a limited affect on the cell. Once saturated, most of the rise in threshold voltage $V_{TH}$ is due to an undesirable injection of remote electrons from non-primary mechanisms.

Therefore, in order to maintain an efficient increase in the threshold voltage $V_{TH}$, and in order to create a pocket of trapped charge close to the drain, it is preferable to remain in the part of the graph (to the left of line 232) where the threshold voltage rise is steep. With stepping of bit line voltage $V_{BL}$, it is possible to remain in the steep slope area (left of line 232).

As an example, when stepping in increments from the designated points 234 to 236, to 238, and to 240, it is possible to achieve equivalent increases in the threshold voltage $V_{TH}$. When observing FIG. 10, it is possible to note that in the range of points 234–240, for each 0.25V increase in the bit line voltage $V_{BL}$, there is a 0.15V increase in the threshold voltage $V_{TH}$.

It is therefore noted that, according to a preferred embodiment of the present invention, a progressively increasing drain voltage $V_D$ causes the threshold voltage $V_{TH}$ to climb along the steep slope of the programming function, and produces a more efficient and quicker programming algorithm.

Figure 11A:
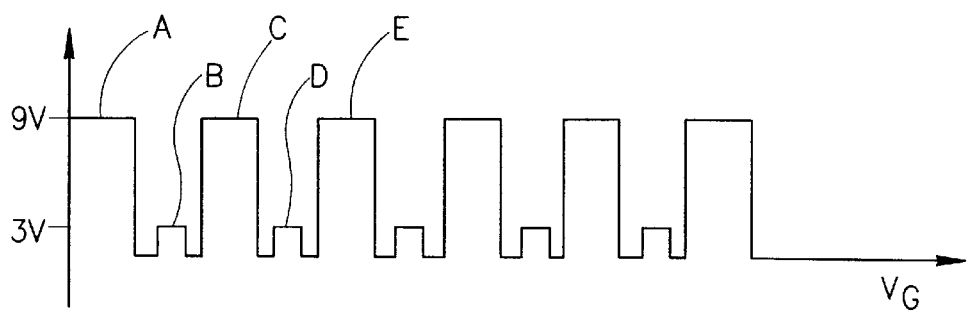
FIGS. 11A, 11B and 11C are graphical illustrations of a programming algorithim, constructed and operated according to a preferred embodiment of the present invention.
Figure 11B:
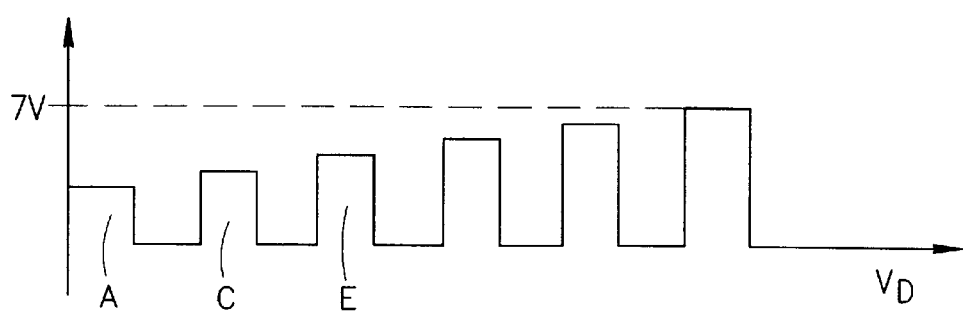
Figure 11C:
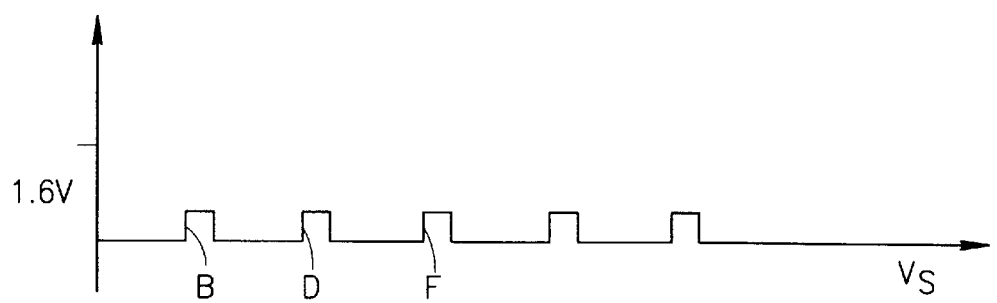

Reference is now made to FIGS. 11A, 11B, and 11C, a series of timing diagrams of a programming algorithm for NROM cells, constructed and operated in accordance with a preferred embodiment of the present invention. Although FIGS. 11A–C illustrate only a limited number of pulses, it Is apparent that a typical programming algorithm comprises numerous pulses and still complies with the principles of the present invention.

FIGS. 11A–11C depict a programming algorithm utilizing gate voltage $V_G$, drain voltage $V_D$, and source voltage $V_S$, respectively. The algorithm additionally comprises a series of alternating programming and program verify pulses. The first pulse is a programming pulse and is designated as A. The second pulse is a program verify pulse and is designated as B, and so on.

The sequence of programming and program verify pulses A, B, C, etc. are repeatedly applied to an array of NROM cells. Once the threshold voltage $V_{TH}$ of an applicable cell has reached a desired level, the programming algorithm is terminated for that specific cell. The programming algorithm proceeds until each cell has reached the desired level, at which point the algorithm is terminated. Preferably the algorithm is applied on a bit by bit basis for either a byte, or word.

With each progressive programming pulse, from A to C to E, the level of the drain voltage $V_D$ increases. Typically, the voltage steps are evenly incremented from progressive drain voltage $V_D$ pulse to pulse, i.e. at fixed increments of 0.25V, or any other desired increment.

Figure 11D:
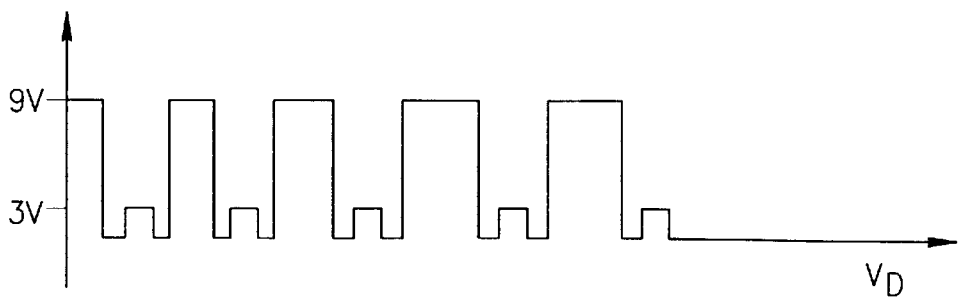

Alternatively, in order to customize the algorithm for diverse programming times, and as a means to improve program speed, the present method teaches unevenly incremented voltage steps, i.e. with smaller incremented steps at the start of the algorithm and larger steps as the algorithm progresses. In this manner, the incremented steps directed to the "fast" programmers are smaller than the incremented steps for the "slow" programmers. Alternatively, as illustrated in FIG. 11D, the incremented steps may be of unequal time duration.

The explanation for such is as follows: When a cell commences programming, its threshold voltage $V_{TH}$ is relatively low. With the application of each progressive programming pulse, the threshold voltage $V_{TH}$ of the cell increases. Each time the threshold voltage $V_{TH}$ increases, a higher programming pulse is needed to force punch-through of electrons. Hence, at the start of the programming algorithm, when the threshold voltage $V_{TH}$ is low, smaller incremental jumps are sufficient to induce punch-through. However, farther into the algorithm, when the threshold voltage $V_{TH}$ is higher, larger steps are needed to produce the punch-through effect. Consequently, by varying the incremental size of the voltage step increases, i.e. with small steps at the beginning when the threshold barrier is still low, and with larger steps when the barrier is higher, it is possible to provide more precise control over the programming algorithm. See for example FIG. 8A, wherein the slope is shallower for the hot temperature cells than for the cooler temperature cells.

According to a preferred embodiment of the present invention, when programming an NROM cell, the gate voltage $V_G$ is high and constant, (e.g. 10V) and the drain voltage $V_D$ is as low as possible, resulting in a narrow spatial distribution of trapped charge. Preferably, the initial bit line voltage $V_D$ is approximately 4V.

When programming with a low initial bit line voltage $V_D$, the resultant spatial distribution of the trapped charge 24 is closer to the diffusion area, which also facilitates effective erasure and increased life cycles. It is additionally noted that, due to the tighter spatial distribution of trapped charge, the present invention produces better two-bit separation and enables better distinction between the two bits during read. Furthermore, a smaller tail of trapped charge results in less erase time and voltage. This in turn, improves retention since less erase stress creates less trapped holes in the nitride. Less trapped holes, improves the retention since there is less trapped movement at the high temperature back.

It is noted that the final step of the drain voltage $V_D$ stops at a level that is just sufficient to reach the desired threshold voltage $V_{TH}$, thus avoiding any unnecessary extra pulses of the drain voltage $V_D$ which might create secondary electron injections far from the junction, imposing the unwanted tail 44.

Frequently, due to architecture density, the applied source voltage $V_S$ is not necessarily ground or 0V. However, in order to provide a tight distribution of charge, it is preferable that source voltage $V_S$ be as close to 0 as possible. and preferably less than 0.3V.

In some instances, it may be known that all of the all cells are "slow" programmers, and thus, in order to shorten the programming time, it is possible to dial-in a higher initial drain voltage $V_D$ (pulse A). As an example and referring again to FIG. 8B, for cells with a longer than average channel length dimension (curve 216), the initial dialed-in drain voltage $V_D$ might be 4V, while for the cells with shorter channel lengths (curve 212), the dial in drain voltage $V_D$ would be 3.1V. In such a manner, for the cells on curve 216, the first few ineffective pulses between 3.1V and 4V are eliminated, and the programming time is shortened.

It will be appreciated by persons skilled in the art that the present invention is not limited to what has been particularly shown and described hereinabove. Rather the scope of the present invention is defined only by the claims that follow:

What is claimed is:

1. method for programming an NROM cell, the method comprising the steps of:
   applying a drain, a source and a gate voltage to said cell;
   verifying a programmed or a non-programmed state of said cell; and
   if said cell is in said non-programmed state:
      increasing said drain voltage; and
      maintaining said gate voltage at a constant level during at least a part of said step of increasing, and
   repeating said steps of applying, verifying, increasing and maintaining until said cell reaches said programmed state.

2. A method for controlling the programming time of an NROM cell, the method comprising the steps of:
   applying a drain, a source and a gate voltage to said cell;
   verifying a programmed or a non-programmed state of said cell; and
   if said cell is in said non-programmed state:
      increasing said drain voltage; and
      maintaining said gate voltage at a constant level during at least a part of said step of increasing, and
   repeating said steps of applying, verifying, increasing and maintaining until said cell reaches said programmed state.

3. The method according to claim 1 or 2, wherein said step of increasing includes the step of stepping said drain voltage.

4. The method according to claim 3, wherein said step of stepping includes the step of executing non-linear steps.

5. The method according to claim 3, wherein said step of stepping includes the step of executing equal amplitude steps.

6. The method according to claim 5, wherein each said equal amplitude step produces an equivalent step in a threshold voltage of said NROM cell.

7. The method according to claim 3, wherein said step of stepping includes the step of executing steps of equal time duration.

8. The method according to claim 3, wherein said step of stepping includes the step of executing steps of unequal time duration.

9. The method according to claim 1 or 2 and further comprising the step of dialing in an initial drain voltage.

10. The method according to claim 1 or 2, wherein said step of maintaining includes the step of changing said gate voltage at least once.

11. The method according to claim 1 or 2, wherein said step of maintaining includes the step of maintaining said gate voltage constant throughout said step of increasing.

12. The method according to claim 1 or 2, wherein said step of applying includes the step of applying a maximum ate voltage to said gate.

13. The method according to claim 1 or 2, wherein said step of applying includes the step of beginning said drain voltage at a low voltage level.

14. The method according to claim 1 or 2, wherein said step of applying includes the step of stopping said drain voltage at a voltage level slightly above a saturated threshold voltage level of said cell.

15. The method according to claim 1 or 2, wherein said step of repeating occurs 3–7 times.

16. A method for confining charge within a predefined region of a retention layer of an NROM cell having a gate, the method comprising the steps, during programming, of;
   applying an incrementally increasing drain voltage to a diffusion area acting as a drain of said cell; and
   maintaining a constant gate voltage on said gate during at least a part of said step of applying;
   verifying a programmed or a non-programmed state of said cell; and
   if said cell is in said non-programmed state, repeating said steps of applying, maintaining and verifying until said cell reaches said programmed state.

17. A method for retaining charge in an NROM cell having a gate and a retention layer, the method comprising the steps of:
   confining said charge within a predefined region of said retention layer of said cell by:
      applying an incrementally increasing drain voltage to a diffusion area acting as a drain of said cell; and
      maintaining a constant gate voltage on said gate during at least a part of said step of applying;
   verifying a programmed or a non-programmed state of said cell; and
   if said cell is in said non-programmed state, repeating said steps of confining and verifying until said cell reaches said programmed state.

18. A method for retaining charge in an NROM cell having a gate and a retention layer, the method comprising the steps of;
   providing a compact spatial charge distribution within a predefined region of said retention layer of said cell by:
      applying an incrementally increasing drain voltage to a diffusion area acting as a drain of said cell; and
      maintaining a constant gate voltage on said gate during at least a part of said step of applying;
   verifying a programmed or a non-programmed state of said cell; and if said cell is in said non-programmed state, repeating said steps of providing and verifying until said cell reaches said programmed state.

19. A method for retaining the separation distance between two charge regions in an NROM cell having a gate and two diffusion areas, the method comprising the steps of, for each charge region:

applying an incrementally increasing drain voltage to the diffusion area closest to said charge region; and maintaining a constant gate voltage on said gate during at least a part of said step of applying;

verifying a programmed or a non-programmed state of said cell; and if said cell is in said non-programmed state, repeating said steps of applying, maintaining and verifying until said cell reaches said programmed state.

20. The method according to any one of claims 16–19, wherein said step of applying begins at a low voltage level.

21. The method according to any one of claims 16–19, wherein said step of repeating includes the step of stopping at a voltage level slightly above a saturated threshold voltage level of said cell.

22. The method according to any one of claims 16–19, and further comprising the step of applying a maximum gate voltage to said gate of said cell.

23. The method according to any one of claims 16–19, wherein said predefined region is close to said diffusion area.

24. The method according to claim 19, wherein said charge regions are close to one of said two diffusion areas.

25. The method according to any one of claims 16–19, wherein said step of applying includes the step of stepping said drain voltage.

26. The method according to claim 25, wherein said step of stepping includes the step of executing non-linear steps.

27. The method according to claim 25, wherein said step of stepping includes the step of executing equal amplitude steps.

28. The method according to claim 27, wherein each said equal amplitude step produces an equivalent step in a threshold voltage of said NROM cell.

29. The method according to claim 25, wherein said step of stepping includes the step of executing steps of equal time duration.

30. The method according to claim 25, wherein said step of stepping includes the step of executing steps of unequal time duration.

31. The method according to any one of claims 16–19, and further comprising the step of dialing in an initial drain voltage.

32. The method according to any one of claims 16–19, wherein said step of maintaining includes the step of changing said gate voltage at east once.

33. The method according to any one of claims 16–19, wherein said step of maintaining includes the step of maintaining said gate voltage constant throughout said step of applying.

34. An NROM cell having charge retained by the method of claim 18 or 19.

35. A charge distribution as created by the method of claim 18 or 19.

36. An NROM cell comprising;

a retention element;

two diffusion areas, one on either side of said retention element; and at least one compact spatial charge distribution within said retention element and near at least one of said diffusion areas, as created by the method of claim 18 or 19.

37. The NROM cell according to claim 36 wherein said charge distribution is removable in generally its entirety.

38. A method for programming an NROM cell, the method comprising the steps, during programming, of:

applying a drain, source and a gate voltage; and while keeping said gate voltage at at least one constant level, increasing said drain voltage until said cell reaches saturation.

39. A method for controlling a change in the threshold voltage of an NROM cell wherein the cell receives a drain, a source and a gate voltage, the method comprising the step, during programming, of varying said drain voltage while keeping said gate voltage at at least one constant level.

40. A method for controlling the programming time of an NROM cell, the method comprising the steps of:

applying a drain, a source and a gate voltage; and while keeping said gate voltage at at least one constant level, incrementally increasing said drain voltage during programming, until said cell reaches saturation.

41. A method for programming an array of NROM cells having varying programming speeds, the array having bit lines and word lines, the method comprising the steps of:

providing a gate voltage to one of said word lines;

providing a source voltage to a first bit line and a drain voltage to a second bit line; and varying said drain voltage while keeping said gate voltage at a constant level until said array of cells reach saturation.

42. A method for retaining the separation distance between two charge regions in an NROM cell, the NROM cell having a gate and two diffusion areas, the method comprising the step of, while applying at least one constant gate voltage to said gate, for each charge region, applying an incrementally increasing bit line voltage to the diffusion area closest to said charge region, until said cell reaches saturation.

43. A method for retaining charge in an NROM cell having a gate and a retention layer, the method comprising the step of providing a compact spatial charge distribution within a predefined region of said retention layer of said cell by applying an incrementally increasing bit line voltage to a diffusion area acting as a drain of said cell, while applying at least one constant gate voltage to said gate, until said cell reaches saturation.

* * * * *